(12) United States Patent
Armstrong et al.

(10) Patent No.: US 9,291,667 B2
(45) Date of Patent: Mar. 22, 2016

(54) ADAPTIVE THERMAL CONTROL

(71) Applicant: Advantest Corporation, Tokyo (JP)

(72) Inventors: David H. Armstrong, Lafayette, CO (US); Mike Callaway, La Mesa, CA (US)

(73) Assignee: ADVANTEST CORPORATION, Tokyo (JP)

( * ) Notice: Subject to any disclaimer, the term of this patent is extended or adjusted under 35 U.S.C. 154(b) by 189 days.

(21) Appl. No.: 14/196,955

(22) Filed: Mar. 4, 2014

(65) Prior Publication Data

US 2014/0253155 A1 Sep. 11, 2014

Related U.S. Application Data

(60) Provisional application No. 61/774,500, filed on Mar. 7, 2013.

(51) Int. Cl.
| | |
|---|---|
| G05D 23/20 | (2006.01) |
| G01R 31/28 | (2006.01) |
| G05D 23/19 | (2006.01) |
| H01L 23/473 | (2006.01) |

(52) U.S. Cl.
CPC ........ G01R 31/2874 (2013.01); G05D 23/1919 (2013.01); H01L 23/4735 (2013.01); H01L 2924/00 (2013.01)

(58) Field of Classification Search
None
See application file for complete search history.

(56) References Cited

U.S. PATENT DOCUMENTS

| | | | | |
|---|---|---|---|---|
| 8,757,250 | B2 * | 6/2014 | Stuckey | G01R 31/2874 165/276 |
| 2010/0163217 | A1 * | 7/2010 | Stuckey | G01R 31/2874 165/180 |
| 2010/0225466 | A1 * | 9/2010 | Liu | G01R 31/2834 340/514 |
| 2014/0062513 | A1 * | 3/2014 | Johnson | G01R 31/2874 324/750.03 |

* cited by examiner

Primary Examiner — Jermele M Hollington

(57) ABSTRACT

An adaptive thermal control system maintains and regulates an accurate and stable thermal environment for a device under test. The adaptive thermal control system includes (i) pre-trigger communications from automatic test equipment (ATE) to automatic thermal control (ATC) allowing slow-responding ATC to start responding to an imminent thermal change before the thermal change occurs, (ii) a control profile which indicates to the ATC, prior to anticipated thermal change, that a change is imminent and the nature of the change over time. The generation and fine-tuning of the control profile can be done by two different methods (i) with the semi-automatic approach the tester does some pre-tests in order to determine a typical response profile which the test program then adjusts using adaptive techniques, (ii) With the fully automatic adaptive circuitries same typical response profile is algorithmically adjusted and utilized to control the ATC.

24 Claims, 10 Drawing Sheets

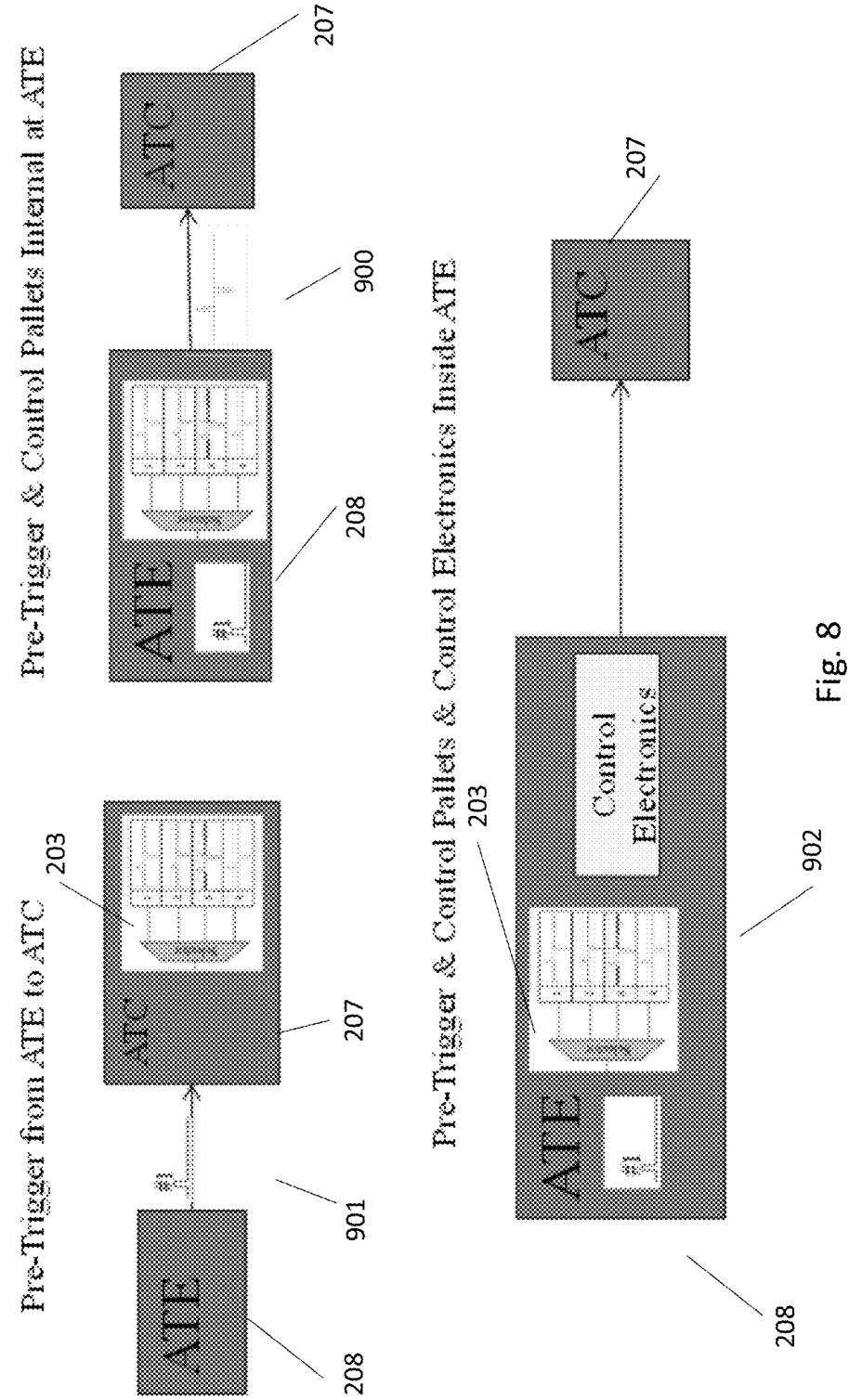

ADAPTIVE THERMAL CONTROL

RELATED APPLICATIONS

This application claims priority to U.S. Provisional Patent Application 61/774,500, entitled, "Adaptive Thermal Control," filed 7 Mar. 2013, by Dave Armstrong and Mike Callaway, attorney docket number ATST-JP0097.A, which is hereby incorporated herein by reference in its entirety.

FIELD OF INVENTION

Embodiments of the present invention relate to the field of semiconductor devices, and temperature control. More specifically, embodiments of the present invention relate to systems and methods for thermal control during device testing.

BACKGROUND

In testing semiconductor devices, it is important to control and maintain an accurate stable thermal environment. Semiconductor devices generally undergo a variety of tests to insure proper operation. During testing, for example, the power level of the device under test (DUT) may vary, causing significant temperature changes of the device. In dealing with this problem there are various conventional techniques to respond to the temperature variations of the device.

Feedback methods are commonly used to sense the temperature variations of the device using a temperature sensing device mounted on the die, case, or heat sink. Some of the problems with these methods are long delays in the feedback and temperature control response time.

Another approach is power following feedback, measuring real time power usage of the device. The real time power measurement of the device is used to determine the real time temperature of the device. One deficiency of power following feedback is that it only follows the power variations not considering other predictive parameters such as frequency, doping levels, simulation results, outside temperature, etc. Without the additional parameters it is impossible for a power following approach to adaptively respond to the full test needs of the DUT. Another deficiency is that it does not control the slow response time of automatic thermal control (ATC) system, thus resulting in temperature over shoot and/or under shoot of the DUT. The power following technique may result in excessive amounts of heating and cooling of the DUT in response to power changes, which is far from optimal.

SUMMARY OF THE INVENTION

Therefore, there is a need for a system and method for sending communications from the automatic test equipment (ATE) to the ATC to address the slow response time of the ATC and quickly anticipate and control the temperature changes of the DUT. A further need exists for a system and method to use a control profile which indicates to the ATC, prior to the anticipated thermal changes, that a change is imminent and also delineates the magnitude and direction of the anticipated thermal change over time. A further need exists for a system and method for the test program to adaptively generate and adjust the control profile using adaptive techniques including various accessible adaptive control circuitry. A further need exists to consider all types of adaptive inputs such as frequency, doping levels, simulation results, outside temperature, thermal contact effectiveness, location on the wafer, etc., when determining a mechanism for thermal control response.

The embodiments of the present invention provide a new and improved way for adaptive temperature control and regulation for a DUT.

Accordingly, embodiments of the present invention provide systems and methods for adaptive thermal control for the DUT that eliminate or reduce the disadvantages and problems associated with the previously developed temperature control technologies for semiconductor devices.

An adaptive thermal control system maintains and regulates an accurate and stable thermal environment for a device under test. The adaptive thermal control system includes (i) pretrigger communications from the automatic test equipment (ATE) to the automatic thermal control (ATC) allowing the slow-responding ATC to start responding to an imminent thermal change before the thermal change occurs, and (ii) a control profile which indicates to the ATC, prior to anticipated thermal change, that a prescribed change is imminent to address the thermal variations. The generation and fine-tuning of the control profile can be done by two different methods (i) the test program using adaptive techniques including various accessible adaptive control circuitry for generating and adjusting the control profile, and (ii) semi automatic adaptive circuitry where the tester does some pre-tests in order to determine the necessary response profile which is algorithmically utilized to control the ATC. The thermal control system may also use fully automatic adaptive circuitry to meet this need.

In accordance with a first embodiment, there is provided a temperature regulation system for a device under test (DUT). The system includes a pretrigger generator for generating a signal in advance of an occurrence of an expected condition of the DUT due to test execution thereon, wherein the expected condition causes thermal variations of the DUT; a profile selector comprising a plurality of selectable control profiles, a subset of which are based on previously measured values and said profile selector triggered by said pretrigger generator, for providing a selected control profile that a-priori models the thermal variations of the DUT caused by the expected condition; a circuit responsive to the selected control profile for determining thermal countermeasures to alleviate the thermal variations; and an automatic thermal control system coupled to the circuit for applying said thermal countermeasures to the DUT in tight synchronization to the occurrence of the expected condition.

In accordance with a second embodiment, there is provided a method of a temperature regulation for a device under test (DUT), the method includes: generating a pretrigger signal in advance of an occurrence of an expected condition of the DUT due to test execution thereon, wherein the expected condition causes thermal variations of the DUT; providing a selected control profile, wherein control profile comprises a plurality of selectable control profiles, a subset of which are based on previously measured values, triggered by the pretrigger signal, wherein the selected control profile a-priori models the thermal variations of the DUT caused by the condition; determining thermal countermeasures responsive to the selected control profile to alleviate the thermal variations; and using an automatic thermal control system, applying the thermal countermeasures to the DUT in advance of the occurrence of the expected condition.

In accordance with a third embodiment of the present invention, a testing apparatus for testing a device under test (DUT), the testing apparatus comprising: an automatic test equipment (ATE) for operating a test execution on the DUT and for comparing test output from the DUT against an expected output for testing the DUT; a pretrigger generator for looking ahead in the test execution and for generating a signal in advance of an occurrence of an expected condition of the DUT due to the test execution thereon, wherein the expected condition causes thermal variations of the DUT; a profile selector comprising a plurality of selectable control profiles, a subset of which are based on previously measured values and said profile selector triggered by the signal of the pretrigger generator, for providing a selected control profile that a-priori models the thermal variations of the DUT caused by the condition, wherein the signal indicates the selected control profile; a circuit responsive to the selected control profile for determining thermal countermeasures to alleviate the thermal variations; and an automatic thermal control system coupled to the circuit for applying the thermal countermeasures to said DUT in advance of the occurrence of the expected condition.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 8 illustrates block diagrams of implementation variations of ATE and ATC.

DETAILED DESCRIPTION

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Adaptive Thermal Control

Figure 1:
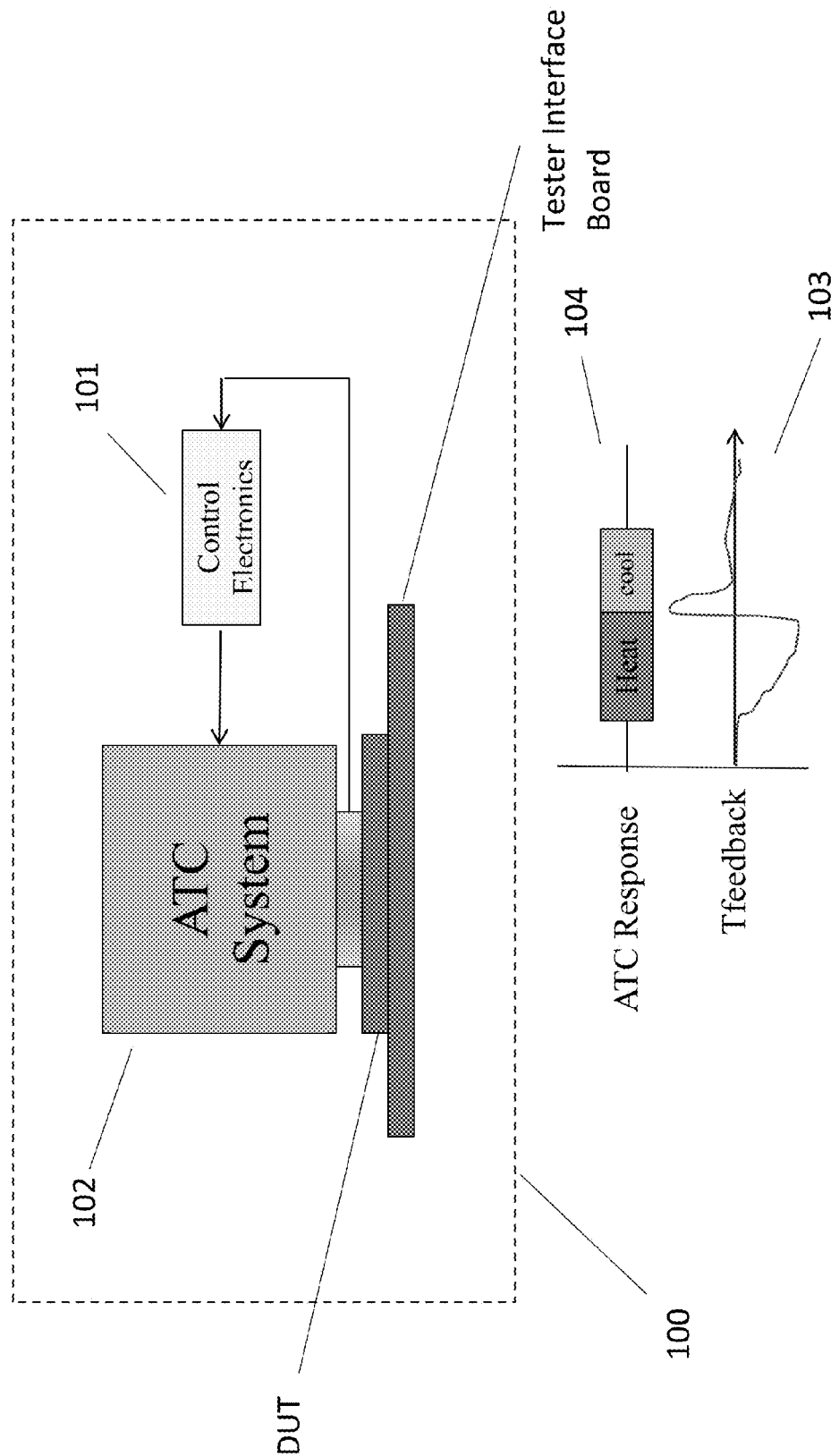
FIG. 1 illustrates an exemplary temperature control feedback loop.

FIG. 1 illustrates a temperature control feedback circuit 100, using simple temperature feedback loop 101, where the feedback temperature 103 is the heat sink temperature. The ATC 102, responds to the temperature variations 104, simply based on the feedback temperature 103 in the system.

Figure 2A:
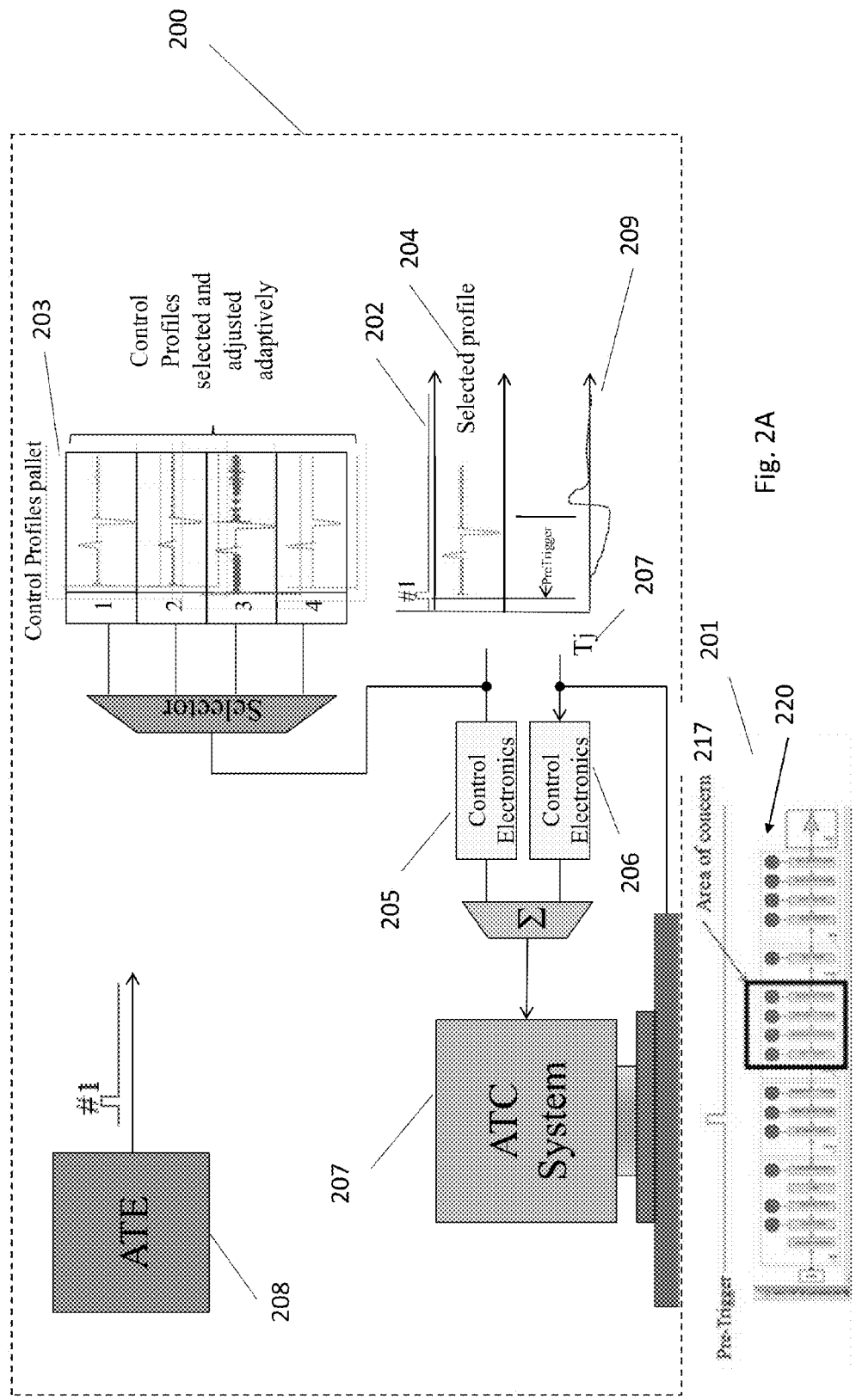
FIG. 2A illustrates an exemplary block diagram of a temperature regulation system and a pretrigger details providing an early trigger signal to the ATC, in accordance with embodiments of the present invention.

FIG. 2A illustrates an exemplary block diagram of a temperature regulation system 200 and a pretrigger 201 details providing an early trigger to the ATC device, in accordance with embodiments of the present invention. Power variations on the DUT can cause significant DUT temperature changes. If the temperature varies beyond acceptable guardbands, test yield may suffer. Pretrigger communication between the ATE and the ATC allows the slow-responding ATC to advantageously start responding to an imminent thermal change before the thermal change occurs. In effect, the ATC can act in anticipation of the thermal change (e.g., area of concern 217), increasing its responsiveness to alleviate the change. The ATE controls the test execution and knows when changes in power levels can occur. Using this knowledge, the ATE 208 uniquely generates a pretrigger signal 215 with sufficient head-way to allow the ATC 207 thermal flow rates to be modulated in a fashion to minimize temperature excursions.

In addition to providing an early trigger to the ATC, the pretrigger signal may include data about which ATC control profile needs to be used for the tests which will soon be executed. The pretrigger is the signal with a pointer to the required control profile in one example. The ATE uses apriori knowledge of the test flow, the knowledge existing in the test-program, to automatically generate a trigger signal to the ATC at a time early enough to compensate for the slow response time typical in the ATC systems. Using the pretrigger results in significant reduction of DUT temperature variations.

FIG. 2A, shows a pretrigger signal 202 generated by ATE 208 with selected profile #1 identified. A test flow running through a sequence 220 and the area of concern 217 is where the profile may be applied. The pretrigger 202 has a pointer that selects a control profile from the control profile pallet 203 which is a memory that stores many sample control profiles. The memory resident control profile pallet 203 may reside in the ATC or the ATE. The selected profile 204 will start executing immediately in the ATC 207 to overcome the delay in the ATC response time. In this example, the selected control profile #1, 204, corresponds to the thermal event that is associated with area of concern 217. FIG. 2A, shows the pretrigger signal 202 generated by the ATE 208, the selected profile 204, the pretrigger duration (e.g., advance warning to the ATC) and the thermal response of DUT 209 to the event that caused the pretrigger.

The control electronics circuits 205 and 206 determine thermal countermeasures, to alleviate the thermal variations of the DUT. The control electronics circuit 205 is the feed-forward countermeasure based on the selected profile 204. And the control electronics circuit 206 generates the real-time feedback countermeasure based on the junction temperature Tj 207 of the DUT and outputs the difference between expected and actual temperature.

A control profile can be a time dependent temperature variation that (i) describes the expected DUT temperature variation due to the event that caused the pretrigger, or (ii) it can be the time dependent countermeasure temperature that can be used to counter-act the DUT temperature variation. The control profile may be a data structure of time dependent values stored in memory.

Figure 2B:
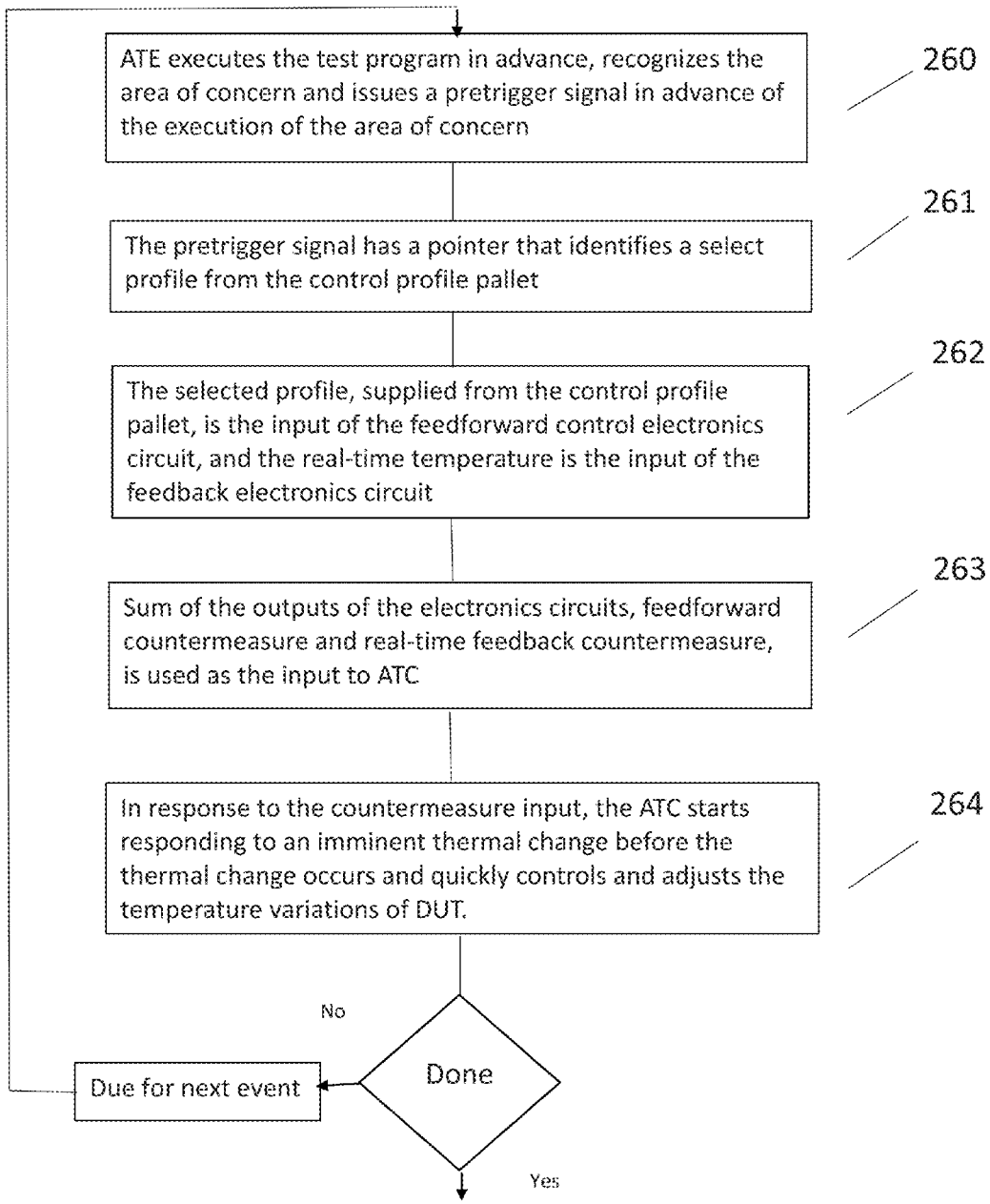
FIG. 2B illustrates an exemplary flowchart of a temperature regulation method and a pretrigger details providing an early trigger signal to the ATC, in accordance with embodiments of the present invention.

FIG. 2B illustrates an exemplary flow chart of a temperature regulation method and a pretrigger details providing an early trigger to the ATC device, in accordance with embodiments of the present invention. In step 260 the ATE 208 executes the test program and recognizes the area of concern or "event" and issues a pretrigger signal. In step 261, the pretrigger signal has a pointer that selects a particular control profile from the control profile pallet 203. In step 262, the selected profile 204 is input to the feedforward control electronics circuit 205, and the real-time junction temperature 207 is the input to the feedback control electronics circuit 206. In steps 263 and 264, sum of the outputs of both control electronics is used as the countermeasure input to the ATC in advance of the thermal event, and in response to the countermeasure, the ATC, starts responding to an imminent thermal change in anticipation of the thermal variations and quickly controls and adjusts the temperature variations of DUT.

Control profile can be generated originally via software simulation of the DUT being tested or they can be determined empirically by testing the DUT and measuring the temperature response. Often it is critical to update the initial control profiles to account for (i) the real-time testing environment of the DUT, and (ii) variable DUT parameters, such as manufacturing characteristics of the device, neighboring device characteristics, and/or other data known about the manufacturing lot the device is a part of.

Figure 3A:
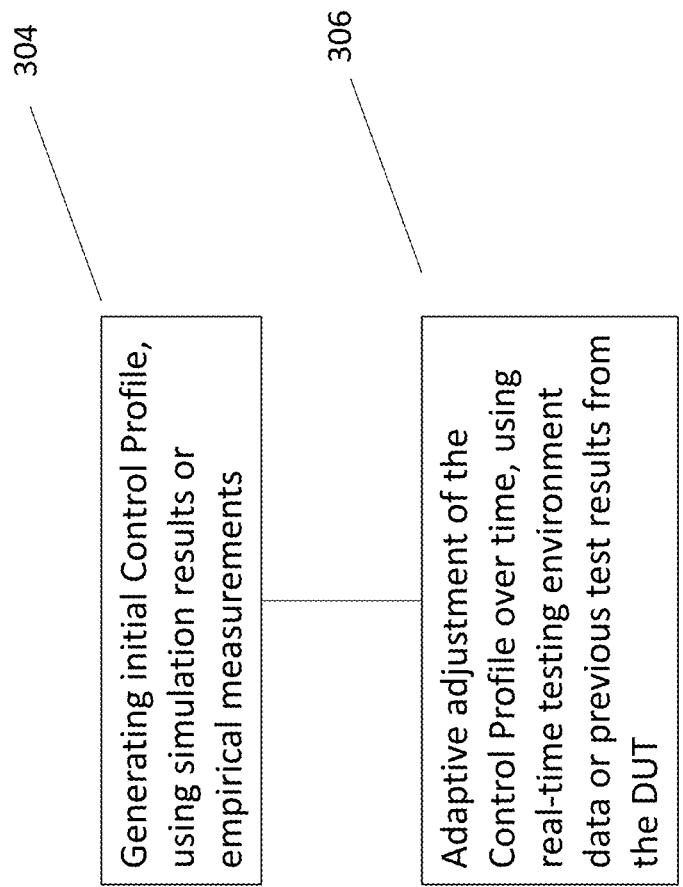
FIG. 3A illustrates an exemplary flowchart of adaptive adjustment of profile values, in accordance with embodiments of the present invention.
Figure 3B:
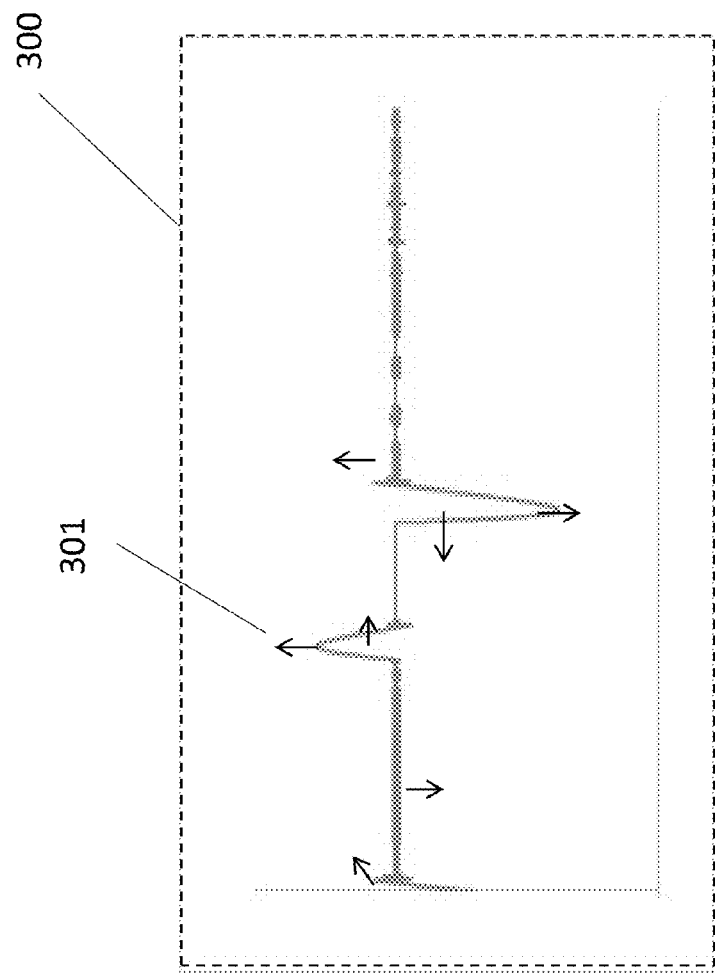
FIG. 3B illustrates an exemplary of adaptive adjustment of profile values, in accordance with embodiments of the present invention.

FIG. 3A illustrates an exemplary flowchart of the generation and adaptive adjustment of control profile values, in accordance with embodiments of the present invention. FIG. 3B illustrates adaptive adjustment of profile values, in accordance with embodiments of the present invention. In FIG. 3A, step 304, shows initial control profile values are generated using either computer simulation results or empirical measurement of the DUT. In step 306, the profile values can be adaptively adjusted over time using real-time testing environment data or previous test results from the DUT to improve accuracy. In FIG. 3B, the arrows 301 represent some exemplar adaptive adjustments and fine tuning of the profile 300 which may be done during the test program execution.

The test program takes the simulated base line values and adjusts the base line adaptively. Any parameter can be adjusted over time to improve the test. There are various ways that the test program can adaptively converge on the right control profile. Simulation data can be used to preload data with adaptive adjustments being done during test program execution. Adjustments may also be done empirically based on previous measured data such as power, frequency, leakage currents, etc., to accurately model the DUT parameters and the test environment. Profile values can be adaptively adjusted over time to achieve a desired on-die temperature profile.

These adjustments can be based on manufacturing parameters, parametric measurements, multiple lot statistical data, results from neighboring device being tested, or previous test results from the DUT. There are at least three different ways for generating the reference control profile and getting the signature of the control profile: measuring the temperature of the device, measuring the power of the device (e.g., these are pre-measured power levels and not real-time), or measuring the temperature and power of the device, as the test program is running and saving the results.

Figure 4:
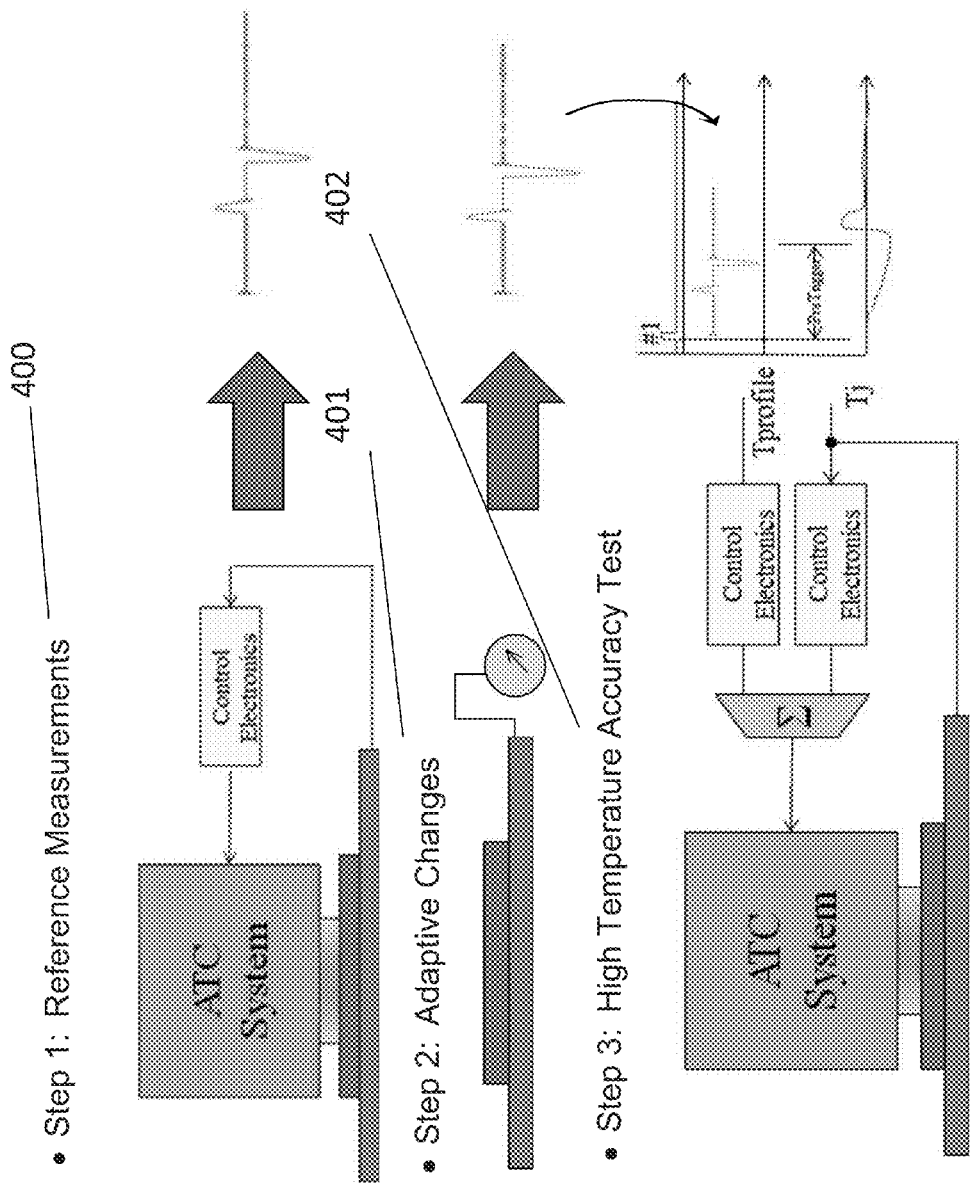
FIG. 4 illustrates steps for semi automatic adaptation approach to determine and adjust the control profile and provide an early trigger signal to ATC, in accordance with embodiments of the present invention.
Figure 5:
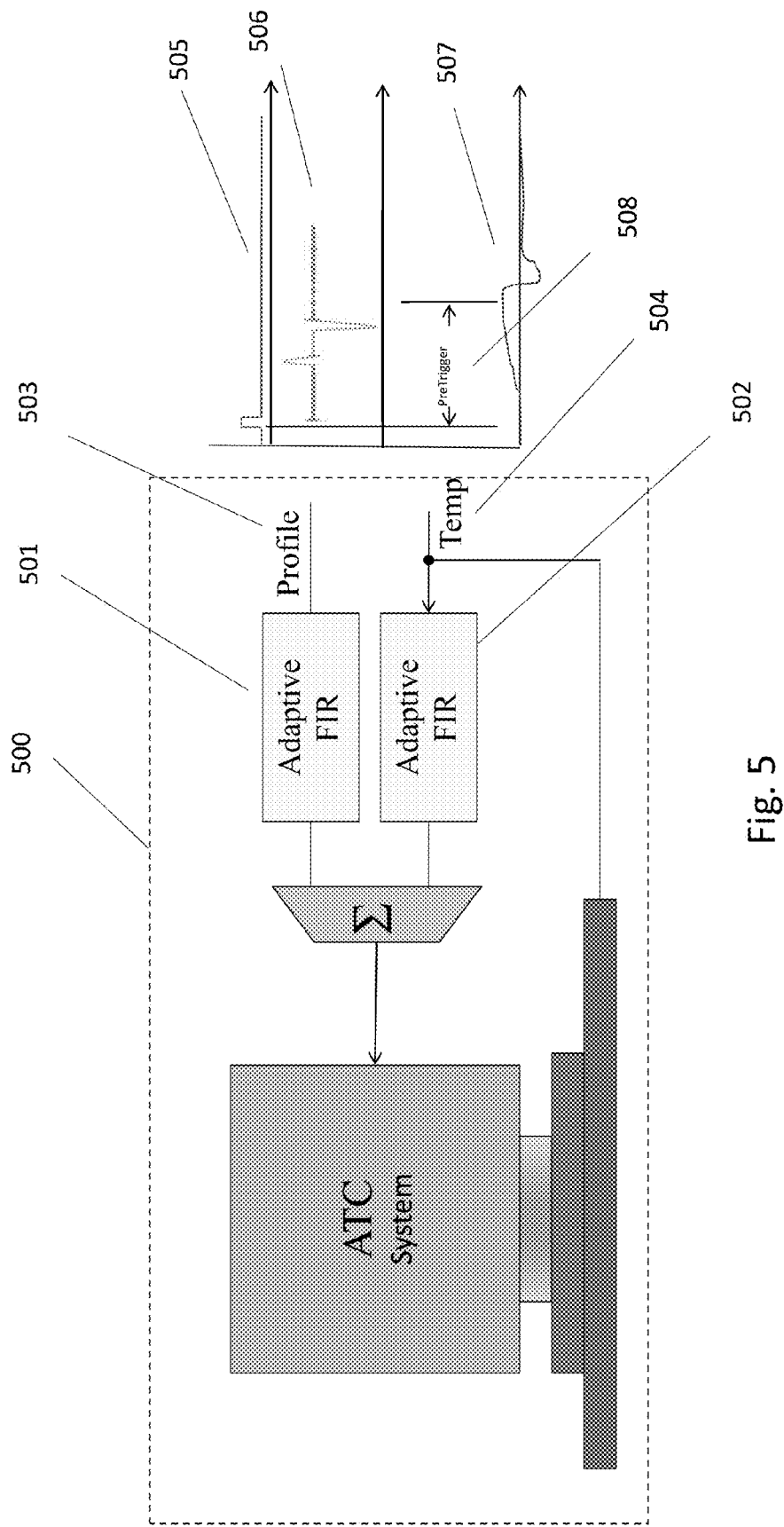
FIG. 5 illustrates an exemplary block diagram of an automatic adaptation circuitry, in accordance with embodiments of the present invention.

There are two different methods for adaptively adjusting the control profile which are explained in detail in FIGS. 4 and 5. Semi automatic (where parametric measurements suggest the adjustments which need to be made) and fully automatic (where the taps of FIR filters are adjusted in order to minimize the temperature error). In both cases the primary input is the control profile which is determined a-priori by measuring a reference device, this same device, or by simulation techniques. The pallet of profiles is generated by looking at a range of devices (e.g., high power, low frequency, different doping densities, etc.).

FIG. 4 illustrates steps for semi automatic adaptation approach to determine and adjust the control profile and provide an early trigger signal to ATC, in accordance with embodiments of the present invention. Step 1: reference measurements 400, shows making reference measurements (temperature, power, or both) on the device and determining the control profile. The Step 1 reference measurements may be performed on the same part that is being tested, another part in the lot, or they could have even been performed early on in the device development during initial characterization of the design. Semi automatic adaptation is when the control profile of the device is selected or adjusted by using the previous measurement results of the device itself or a previous device. This profile is then used together with the pretrigger signal to heat and cool the device in a fashion synchronized with the test program in order to compensate for thermal variations.

Steps 2 and 3, 401 and 402, show adaptive changes made to the reference control profile by the test program. Adjustments on the reference profile can be done by the test program as parametric changes are noted and/or temperature errors on differences between the DUT and the reference device used for reference profile generation are noted.

FIG. 5 illustrates a block diagram of an automatic adaptation circuitry 500, in accordance with embodiments of the present invention. The automatic adaptive thermal control uses device feedback to adjust tap coefficients on the two adaptive finite impulse response (FIR) filters 501 and 502. The input of the first FIR filter 501 is the control profile 503 as previously discussed. The accuracy of these values is not critical as the adaptive FIR filter will automatically adapt in order to compensate for any delay, offset, or gain errors. The input of the second FIR filter 502 is the real-time feedback temperature 504. Sum of the outputs of both FIR filters, 501 and 502, is the countermeasure input to the ATC. Both adaptive filters, 501 and 502, self-adapt their control parameters to provide optimum temperature response.

In FIG. 5, the timing chart shows the pretrigger signal 505 generated by the ATE, the selected control profile 506 being applied early before the thermal event, the pretrigger duration 508 is the advance warning time to the ATC, and the expected thermal response of DUT 507 to the event that caused the trigger.

Figure 6:
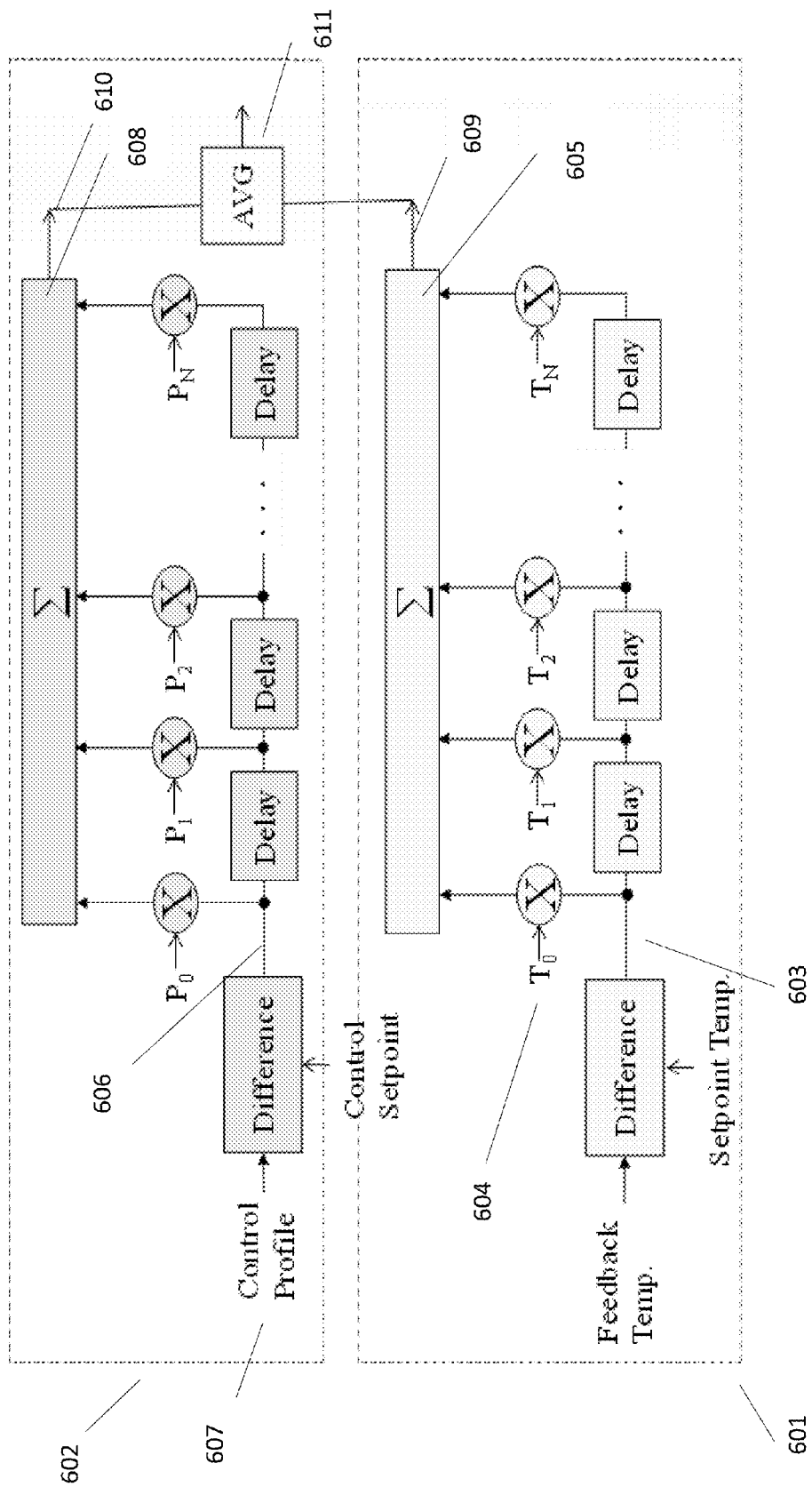
FIG. 6 an exemplary block diagram of adaptive FIR filters for the fully automatic adaptation approach, in accordance with embodiments of the present invention.

FIG. 6 illustrates a block diagram of adaptive FIR filters for the fully automatic adaptation approach. The FIR filter 601 is a post-processor filter. The input to this filter is the temperature error 603 which is the difference between the setpoint temperature and the feedback temperature. The temperature error 603 is multiplied by convergent gain coefficient $T_0$, 604. As more samples of the device temperature come into the circuit, the values of the temperature error 603 shift-down the central delay line. Each tap of the delay line gets multiplied by a different coefficient and these values get summed together in one summing circuit 605. The output of the summing node 609 is the countermeasure control signal to the ATC.

The FIR filter 602 is a pre-processor filter. The input to this filter 606 is the difference between the control setpoint (in case of temperature then control setpoint is the same as setpoint temperature) and the control profile 607 where the control profile 607 could be power, frequency, etc. The length of time included in the delay line of the pre-processor FIR 602 has to be greater than the ATC response time. The pre-processor filter 602 works similar to the post-processor filter 601. The output of the summing node 608 is the countermeasure control signal 610 to the ATC. And the output of the averaging node 611 takes the mathematically combines the two countermeasure outputs of post-processor 601 and pre-processor 602 FIRs, and determines the final countermeasure control signal 611 to the ATC.

Figure 7A:
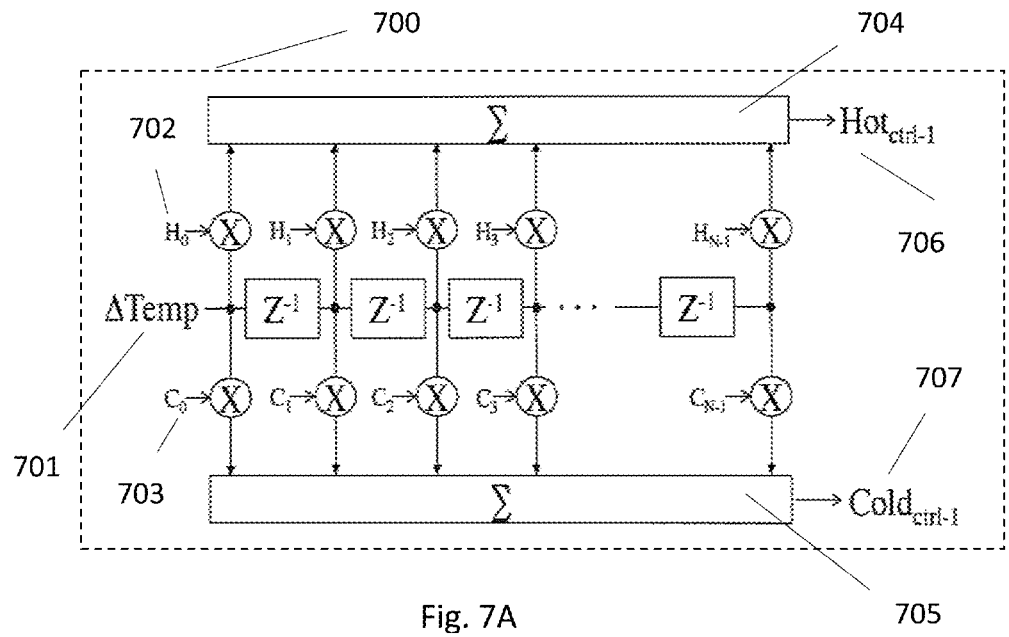
FIG. 7A illustrates an exemplary circuit block diagram of the adaptive thermo control path using FIR filter, in accordance with embodiments of the present invention.
Figure 7B:
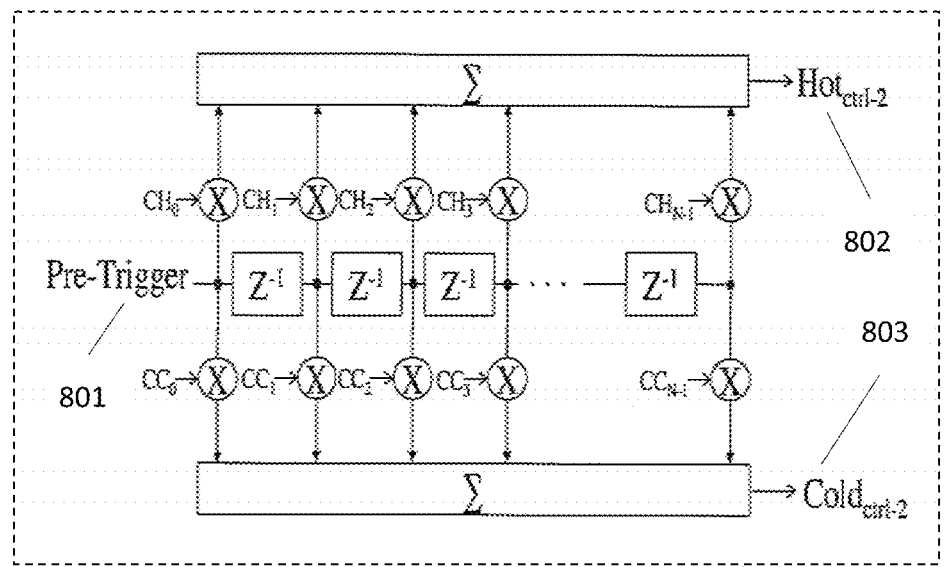
FIG. 7B illustrates an exemplary circuit block diagram of the pretrigger signal path using FIR filter, in accordance with embodiments of the present invention.

FIGS. 7A and 7B illustrate block diagrams of an adaptive thermo control path 700, and pretrigger signal control path 800 circuits, using two independent FIR filters, in accordance with an alternative embodiment of the present invention. The input to the adaptive thermo control path 700 filter is $\Delta$Temp 701, that is the difference between the set point temperature and the actual measured temperature. This signal 701 is multiplied by convergent gain coefficients $H_0$ and $C_0$, 702 and 703 respectively. As more samples of the device temperature come into the circuit the values of $\Delta$Temp 701 shift-down the central delay line. Each tap of the delay line gets multiplied by different coefficients and these values get summed together in two separate summing circuits 704 and 705, (one for hot and one for cold). The outputs of these summing nodes are $\text{Cold}_{ctrl-1}$ and $\text{Hot}_{ctrl-1}$, 706 and 707 respectively.

The pretrigger signal 801 is handled in a very similar fashion to the temperature control signal path. The outputs of these summing nodes are $\text{Cold}_{ctrl-2}$ 802 and $\text{Hot}_{ctrl-2}$ 803. The $\text{Cold}_{ctrl-1}$ 707 and $\text{Hot}_{ctrl-1}$ 706 are mathematically combined together with the $\text{Cold}_{ctrl-2}$ 803 and $\text{Hot}_{ctrl-2}$ 802, respectively, and the resulting signals are used to control the temperature of the thermal fluid to the heat-sink which is heating and cooling the DUT. The delay lines together with the convergent circuits 700 and 800 allow this invention to home in on the optimal signal delay and gain in order to minimize the temperature variations seen by the DUT.

FIG. 8 illustrates block diagrams of implementation variations of the ATE and the ATC. The tester and automatic thermal control system are usually located remote from each other. The communications from the ATE to the ATC, by sending the pretrigger signal, allows the slow-responding ATC to quickly control the temperature variations of the DUT.

FIG. 8, shows different embodiments of the present invention. In the block diagram 900, the pretrigger and the control profile pallet may reside in the ATE and the output of the ATE is just the profile data. In the block diagram 901, the control profile pallet resides in the ATC and the ATE sends the pretrigger signal to the ATC. In the block diagram 902, the pretrigger, the control profile pallets and control electronics reside in the ATE. In this case, the output of the ATE is the countermeasure indicating to the ATC to increase or decrease the temperature. In accordance with embodiments of the present invention, pretrigger may exist as a signal or it may be hidden, and the control profile pallets, may reside in the ATC or the ATE.

Embodiments in accordance with the present invention allow the ATC to anticipate temperature change and pre-adjust its flows and settings in order to respond more quickly to the temperature changes.

Embodiments in accordance with the present invention also provide a measured response which more closely mirrors the thermal environment that the DUT will experience in its end use environment.

Embodiments in accordance with the present invention further utilize many forms of heuristic data (from other tests or parts) in order to modulate the thermal response in a fashion to filter out marginal devices and thus improve the device reliability.

Embodiments in accordance with the present invention are well suited for the automotive industry where demand for high temperature performance and high reliability are crucial. The present invention allows to keep the thermal envelop well controlled. It is beneficial for the automotive industry to have this control available.

Embodiments in accordance with the present invention provide a fully automatic adaptive approach that compensates on-the-fly to changes in the test environment. The types of changes that are automatically compensated for, for example, include changing thermal resistance, changing thermal mass, changing power levels, changing room temperature and humidity, changing cooling fluid temperature, calibration changes, and changing delays in the interface electronics.

Embodiments in accordance with the present invention allow for all types of parameters to be adaptively adjusted in the control profile, or to be used as inputs to make the adaptive adjustments to the control profile. Many different device testing parameters which might be involved in this control profile and thus help the ATC to anticipate thermal response, for example, are device power (Vcc, Icc, IddQ, Vdroop, etc.), device performance (frequency, noise, etc.), device configuration (# cores enabled, package type, temperature range, etc.), thermal interface data (resistance, mass, etc.), environmental data (room temperature, humidity, etc.), neighboring device data, and field return data. While the different types of parameters to be adaptively adjusted in the control profile, or to be used as inputs to make the adaptive adjustments to the control profile are described in particular embodiments, it should be appreciated that the invention should not be construed as limited by such embodiments.

Various embodiments of the invention are thus described. While the present invention has been described in particular embodiments, it should be appreciated that the invention should not be construed as limited by such embodiments, but rather construed according to the below claims.

What is claimed is:

1. A temperature regulation system for a device under test (DUT), said temperature regulation system comprising:
    a pretrigger generator for generating a signal in advance of an occurrence of an expected condition of said DUT due to test execution thereon, wherein said expected condition causes thermal variations of said DUT;
    a profile selector, comprising a plurality of selectable control profiles, a subset of which are based on previously measured values and said profile selector triggered by said pretrigger generator, for providing a selected control profile that a-priori models said thermal variations of said DUT caused by said expected condition;
    a circuit responsive to said selected control profile for determining thermal countermeasures to alleviate said thermal variations; and
    an automatic thermal control system coupled to said circuit for applying said thermal countermeasures to said DUT in advance of said occurrence of said expected condition.

2. A temperature regulation system as described in claim 1 wherein said expected condition is selected from a group comprising: an expected frequency of operation of said DUT; an expected power dissipation of said DUT; and an expected operational configuration of said DUT.

3. A temperature regulation system as described in claim 1 further comprising a temperature sensor for measuring a real-time temperature of said DUT and for generating, in response thereto, a real-time temperature signal and wherein said circuit is responsive to said real-time temperature signal in addition to said selected control profile for determining said thermal countermeasures.

4. A temperature regulation system as described in claim 3 wherein said circuit comprises one or more adaptive filter circuits.

5. A temperature regulation system as described in claim 3 wherein said circuit comprises one or more proportional-integral-derivative (PID) circuits.

6. A temperature regulation system as described in claim 1 wherein said plurality of control profiles correspond to a plurality of expected conditions and wherein further said profile selector selects said selected control profile based on information that is integrated within said signal from said pretrigger generator.

7. A temperature regulation system as described in claim 6 wherein each control profile is initially determined via simulation of said test execution on said DUT and further operable to be adaptively modified in accordance with one of: manufacturing parameters of said DUT; parametric measurements of said DUT; and previous test results of said DUT.

8. A temperature regulation system as described in claim 6 wherein each control profile is initially empirically determined via said test execution on a reference DUT and further operable to be adaptively modified in accordance with one of: manufacturing parameters of said DUT; parametric measurements of said DUT; and previous test results of said DUT.

9. A method of a temperature regulation for a device under test (DUT), said method comprising:
generating a pretrigger signal in advance of an occurrence of an expected condition of said DUT due to test execution thereon, wherein said expected condition causes thermal variations of said DUT;
providing a selected control profile, wherein control profile comprises a plurality of selectable control profiles, a subset of which are based on previously measured values, triggered by said pretrigger signal, wherein said selected control profile a-priori models said thermal variations of said DUT caused by said condition;
determining thermal countermeasures responsive to said selected control profile to alleviate said thermal variations; and
using an automatic thermal control system, applying said thermal countermeasures to said DUT in advance of said occurrence of said expected condition.

10. The method described in claim 9 wherein said expected condition is selected from a group comprising: an expected frequency of operation of said DUT; an expected power dissipation of said DUT; and an expected operational configuration of said DUT.

11. The method described in claim 9 further comprising: measuring a real-time temperature of said DUT; and generating, in response thereto, a real-time temperature signal, and wherein said determining is responsive to said real-time temperature signal in addition to said selected control profile for determining said thermal countermeasures.

12. The method described in claim 11 wherein said determining uses one or more adaptive finite impulse response (FIR) circuits.

13. The method described in claim 11 wherein said determining uses one or more proportional-integral-derivative (PID) circuits.

14. The method described in claim 9 wherein said selecting selects said selected control profile from a plurality of control profiles corresponding to a plurality of expected conditions.

15. The method as described in claim 14 further comprising:
simulating said test execution on said DUT to initially determine each control profile; and adaptively modifying each control profile in accordance with one of: manufacturing parameters of said DUT; parametric measurements of said DUT; and previous test results of said DUT.

16. The method as described in claim 14 further comprising: simulating said test execution on said DUT to initially determine each control profile; and adaptively modifying each control profile in accordance with one of: device power, device performance, device configuration, thermal interface data, environmental data, neighboring device data, and field return data.

17. A testing apparatus for testing a device under test (DUT), said testing apparatus comprising:
an automatic test equipment (ATE) for operating a test execution on said DUT and for comparing test output from said DUT against an expected output for testing said DUT;
a pretrigger generator for looking ahead in said test execution and for generating a signal in advance of an occurrence of an expected condition of said DUT due to said test execution thereon, wherein said expected condition causes thermal variations of said DUT;
a profile selector comprising a plurality of selectable control profiles, a subset of which are based on previously measured values and said profile selector triggered by said signal of said pretrigger generator, for providing a selected control profile that a-priori models said thermal variations of said DUT caused by said condition, wherein said signal indicates said selected control profile;
a circuit responsive to said selected control profile for determining thermal countermeasures to alleviate said thermal variations; and
an automatic thermal control system coupled to said circuit for applying said thermal countermeasures to said DUT in advance of said occurrence of said expected condition.

18. A testing apparatus as described in claim 17 wherein said expected condition is selected from a group comprising: an expected frequency of operation of said DUT; an expected power dissipation of said DUT; and an expected operational configuration of said DUT.

19. A testing apparatus as described in claim 17 further comprising a temperature sensor for measuring a real-time temperature of said DUT and for generating, in response thereto, a real-time temperature signal and wherein said circuit is responsive to said real-time temperature signal in addition to said selected control profile for determining said thermal countermeasures.

20. A testing apparatus as described in claim 19 wherein said circuit comprises one or more adaptive finite impulse response (FIR) circuits.

21. A testing apparatus as described in claim 19 wherein said circuit comprises one or more proportional-integral-derivative (PID) circuits.

22. A testing apparatus as described in claim 17 wherein said plurality of control profiles correspond to a plurality of expected conditions.

23. A testing apparatus as described in claim 22 wherein each control profile is initially determined via simulation of said test execution on said DUT and further operable to be adaptively modified in accordance with one of manufacturing parameters of said DUT; parametric measurements of said DUT; and previous test results of said DUT.

24. A testing apparatus as described in claim 22 wherein each control profile is initially empirically determined via said test execution on a reference DUT and further operable to be adaptively modified in accordance with one of manufacturing parameters of said DUT; parametric measurements of said DUT; and previous test results of said DUT.

* * * * *